United States Patent [19]
Shimura

[11] Patent Number: 5,852,619
[45] Date of Patent: Dec. 22, 1998

[54] PATTERN GENERATOR CIRCUIT FOR SEMICONDUCTOR TEST SYSTEM

[75] Inventor: Michio Shimura, Hanyu, Japan

[73] Assignee: Advantest Corp., Tokyo, Japan

[21] Appl. No.: 986,469

[22] Filed: Dec. 8, 1997

Related U.S. Application Data

[63] Continuation of Ser. No. 677,016, Jul. 8, 1996, Pat. No. 5,751,738.

[30] Foreign Application Priority Data

Jul. 11, 1995 [JP] Japan .................................... 7-198135

[51] Int. Cl.$^6$ .................................................... G06F 11/00
[52] U.S. Cl. ............................................................ 371/27.7
[58] Field of Search ................................. 371/27.7, 27.1, 371/27.5, 27.66, 28; 398/182.01

[56] References Cited

U.S. PATENT DOCUMENTS 5,602,999  2/1997  Hyatt ........................................ 395/401
5,613,077  3/1997  Leung et al. ........................ 395/182.01

Primary Examiner—Vincent P. Canney
Attorney, Agent, or Firm—Muramatsu & Associates

[57] ABSTRACT

A pattern generator that makes it possible to use various option pattern generators (PGs) without changing hardware is realized. To accomplish this, an option circuit includes an option PG initial clock control section that generates an initial clock signal in synchronism with a clock signal to initialize the option PGs; a plurality of option PGs selectively receive one of a plurality of clock output signals of a clock output control section and generate pattern and clock signals; and in a multiplexer which selects one of output signals from the plurality of PGs through an instruction from a select register 24, and a FIFO section which receives a signal from the multiplexer as write data and a write clock, and an output signal of a read clock control section as a read clock, and outputs a signal to a logic circuit as the option PG output signal.

11 Claims, 5 Drawing Sheets

5,852,619

PATTERN GENERATOR CIRCUIT FOR SEMICONDUCTOR TEST SYSTEM

This is a continuation of U.S. patent application Ser. No. 08/677,016 filed Jul. 8, 1996 now U.S. Pat. No. 5,751,738.

FIELD OF THE INVENTION

The present invention relates to a pattern generator circuit that makes it possible to add various option pattern generators to the pattern generators of semiconductor test equipment without changing the hardware.

BACKGROUND OF THE INVENTION

FIG. 4 shows a conventional pattern generator circuit with an added option pattern generator. The main sections that make up this circuit are as follows: clock generator 50, which generates CLK1, CLK2, and CLK3; main PG (pattern generator) 10 (made up of $n_1$ pipeline stages), which is clocked by CLK1; register 11, into which the output of main PG 10 is clocked by CLK2; delay circuit A (12), which delays the output signal from register 11; logic circuit 13, which ORs the output of delay circuit A (12) with the output of the option PG; and register 14, which has the output of logic circuit 13 clocked into it by CLK3, and generates the PAT (pattern) signal.

The option circuit is made up of option PG-A 51 (made up of $n_2$ pipeline stages), which is clocked by CLK1; shift register 52, which adds ($n_1-n_2$) pipeline stages to the end of PG-A 51; shift register 53, into which the output of register 52 is clocked by CLK2; delay circuit E (54), which delays the output signal coming from register 53; option PG-B (55), clocked by CLK2, which is configured to provide delayed operation with no pipeline; and multiplexer 56, which selects the output of either delay circuit E (54), or option PG-B (55), depending on the state of a select signal received from select register 57, and outputs it to logic circuit 13 as the option PG output.

FIG. 5 is an example of a timing diagram for a conventional pattern generator.

In this conventional pattern generator, main PG 10 has $n_1$ pipeline stages. Therefore, the first pattern does not appear in its output until ($n_1+1$) clocks have been input. Consequently, if an option PG-A having $n_2$ pipeline stages (where $n_2$ is less than $n_1$) is connected; then in order to use the same CLK1 to operate both PGs, ($n_1-n_2$) additional pipeline stages must be added to option PG-A. In addition, in order to connect an option PG-B (55) configured for delayed operation with no pipeline, both the main PG and option PG-A must be delayed by an amount equal to d, the delay introduced by PG-B.

The following problems are created by configuring the total circuit in this manner, such that the number of pipeline stages and the amount of delay are hardware-dependent:

1) Circuit designers have very little freedom in the design of the option PG, and the circuits are therefore limited.
2) The entire PG must be redesigned to add a new option PG.

The object of the present invention is to provide a pattern generator in which it is possible to use a variety of option PGs without making hardware changes.

SUMMARY OF THE INVENTION

The pattern generator of the present invention is constituted as follows:

In a pattern generator, a main portion of which comprises a clock generator 20 which generates CLK1, CLK2, and CLK3; a main PG (pattern generator) 10 (made up of $n_1$ pipeline stages), which is clocked by CLK1; a register 11, into which the output of main PG 10 is clocked by CLK2; a delay circuit A (12), which delays the output signal from register 11; a logic circuit 13, which ORs the output of a delay circuit A (12) with the output of an option PG; and a register 14, which has the output of logic circuit 13 clocked into it by CLK3, and which generates the PAT (pattern) signal; is an option circuit that comprises an option PG initial clock control section 21 that generates an initial clock signal (INITCLK) synchronous with a CLK4 from clock generator 20, and initializes various option PGs and a FIFO (first in first out) section 31; an option PG clock control section 22 that inputs an enable signal that was generated by main PG 10 and delayed by a delay circuit B (33), and generates a clock output signal synchronous with CLK2; a read clock (RCLK) control section 23 that inputs an enable signal that is generated from main PG 10 and delayed by delay circuit B (33) and delay circuit C (34), and generates a clock output signal that is synchronous with a CLK5 output from clock generator circuit 20 synchronous with CLK3; a clock output control section 26, which inputs the result obtained by taking, in logic circuit 25, the logical OR of the clock output signal of option PG clock control section 22 and the INITCLK signal of option PG initial clock control section 21, and selects, through the operation of select register 24, one output of a plurality of clock outputs, for its output; a plurality of option PGs 27, 28, and 29, each of which inputs one of a plurality of clock output signals output by clock output control section 26, and outputs pattern data and clock signals; and a FIFO section 31, which, through the operation of select register 24, selects, in multiplexer 30, the output signals of one of a plurality of option PGs as its write data (WDT) and write clock (WCLK) inputs, and also inputs as RCLK (read clock), the signal obtained by ORing, in logic circuit 32, the INITCLK output signal of option PG initial clock control section 21, after it has been delayed by delay circuit 35, with the output of RCLK control section, and outputs a signal to logic circuit 13 as the option PG output signal.

In addition, as shown in FIG. 2, option PG initial clock control section 21 comprises an initial clock register 41 that can be set to the desired number of pipeline stages to initialize the option PG; a clock division ratio register 42 that sets the clock division ratio of a clock (CLK4) such as to set the initial clock (INITCLK) frequency to an operating frequency at which it is possible to operate the option PG; a clock divider circuit 43 that, with CLK4 as its input, generates a divided clock output in accordance with the setting of clock division ratio register 42; a counter 44, which has the contents of initial clock register 41 loaded into it by the LOADCMD signal, and is counted by the divided clock signal, which is the output of clock divider circuit 43; and a counter ≠0 detector circuit 45, which detects the fact that the output of counter 44 has become "0," to control the output of the divided clock signal, which is the output of clock divider circuit 43, as the INITCLK signal.

In a pattern generator constituted as described above, an option PG and FIFO 31 can be initialized to have the desired number of pipeline stages by an INITCLK signal generated by option PG initial clock control section 21.

In addition, for an option PG with no pipeline, operating in delayed operation, within a range determined by delay time d, the delay time can be absorbed by FIFO section 31.

In addition, within a range determined by p1, where p1 is the number of patterns generated by main PG 10, the number of patterns generated by the option PG can be controlled by the enable signal generated by main PG 10.

DETAILED DESCRIPTION OF THE INVENTION

Figure 1:
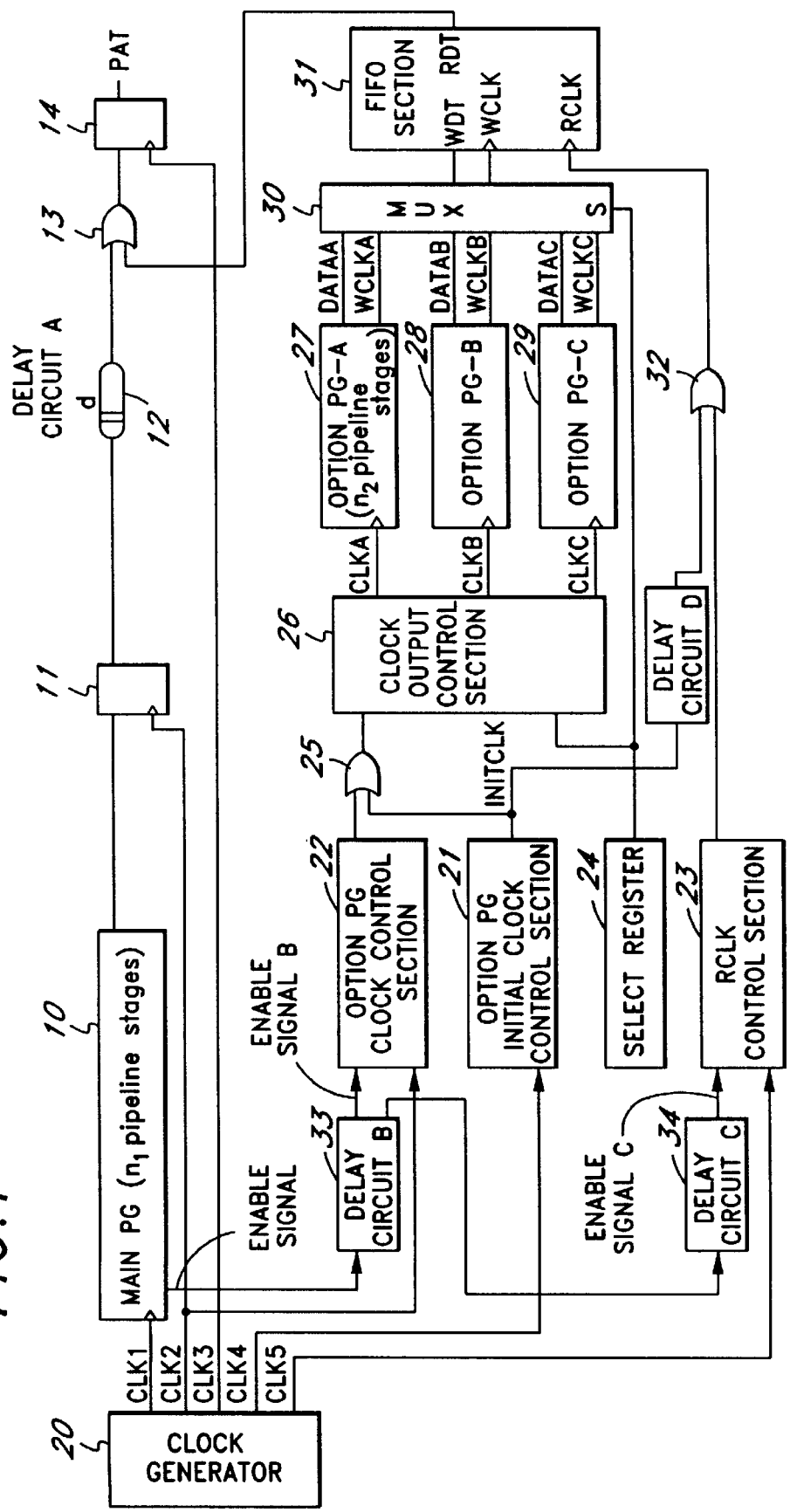
FIG. 1 is a block diagram of the pattern generator of the present invention.

FIG. 1 is a block diagram of the pattern generator of the present invention. For this circuit, in a main section comprising a clock generator 20, which generates a first clock (CLK1), second clock (CLK2), and a third clock (CLK3); a main PG 10 (made up of $n_1$ pipeline stages), which is clocked by CLK1; a register 11, into which the output of main PG 10 is clocked by CLK2; a delay circuit A (12), which delays the output signal of register 11; a logic circuit 13, which ORs the output of a delay circuit A (12) with the output of an option PG; and a register 14, which has the output of logic circuit 13 clocked into it by CLK3, and generates the PAT (pattern) signal; is an option circuit comprising an option PG initial clock control section 21 that generates an initial clock signal (INITCLK) that is synchronous with a fourth clock (CLK4) from clock generator 20 and initializes various option PGs and a FIFO (first in first out) section 31; an option PG clock control section 22 that inputs an enable signal that was generated by main PG 10 and delayed by a delay circuit B (33), and generates a clock output signal that is synchronous with CLK2; a read clock (RCLK) control section 23 that inputs an enable signal that is generated from main PG 10 and delayed by delay circuit B (33) and delay circuit C (34), and generates a clock output signal that is synchronous with a fifth clock (CLK5) output from clock generator circuit 20 synchronous with CLK3; a clock output control section 26, which inputs the result obtained by taking, in logic circuit 25, the logical OR of the clock output signal of option PG clock control section 22 and the INITCLK signal of option PG initial clock control section 21, and selects, through the operation of select register 24, one output of a plurality of clock outputs, for its output; a plurality of option PGs 27, 28, and 29, each of which inputs one of a plurality of clock output signals output by clock output control section 26, and outputs pattern data and clock signals; and a FIFO section 31, which, through the operation of select register 24, selects, in multiplexer 30, the output signals of one of a plurality of option PGs as its write data (WDT) and write clock (WCLK) inputs, and also inputs as RCLK (read clock), the signal obtained by ORing, in logic circuit 32, the INITCLK output signal of option PG initial clock control section 21 after it has been delayed by delay circuit 35, with the output of the RCLK control section 23, and outputs a signal to logic circuit 13, as the option PG output signal.

Figure 2:
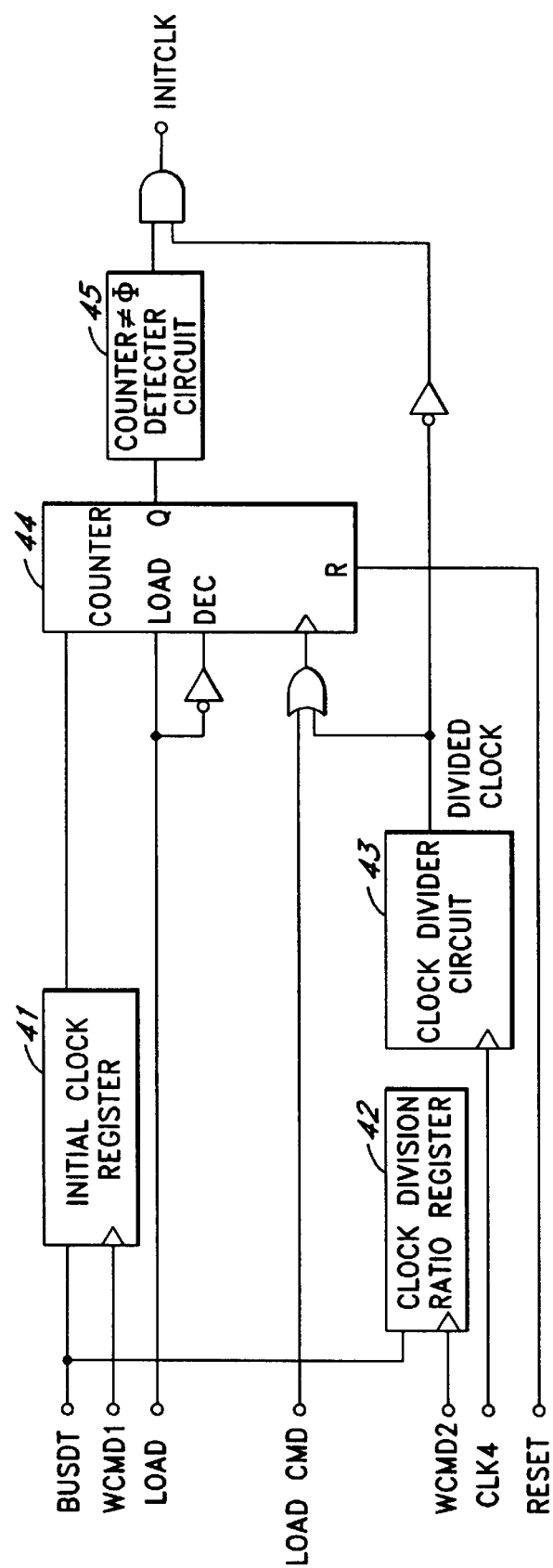
FIG. 2 is a block diagram of the option PG initial clock control section of the present invention.

In addition, as shown in FIG. 2, option PG initial clock control section 21 comprises an initial clock register 41 that can be set to the desired number of pipeline stages to initialize the option PG; a clock division ratio register 42 that sets the clock division ratio of the clock (CLK4) in order to set the initial clock (INITCLK) frequency to an operating frequency at which it is possible to operate the option PG; a clock divider circuit 43 that, with CLK4 as its input, generates a divided clock output in accordance with the setting of clock division ratio register 42; a counter 44, which has the contents of initial clock register 41 loaded into it by the LOADCMD signal, and is counted by the divided clock signal, which is the output of clock divider circuit 43; and a counter ≠0 detector circuit 45, which detects the fact that the output of counter 44 has become "0," to control the output of the divided clock signal, which is the output of clock divider circuit 43, as the INITCLK signal.

Figure 3:
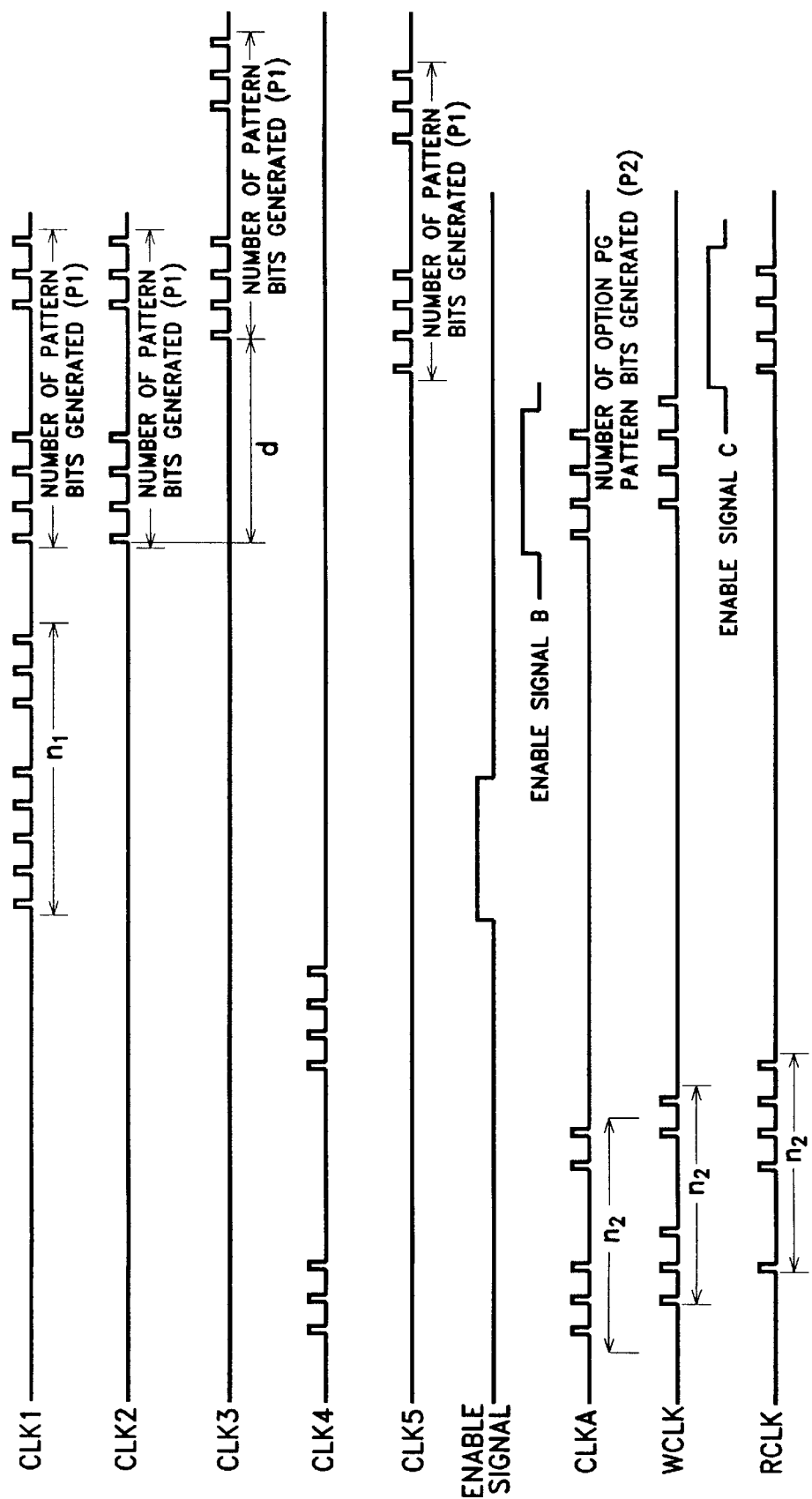
FIG. 3 is an example of a timing diagram for the present invention.
Figure 4:
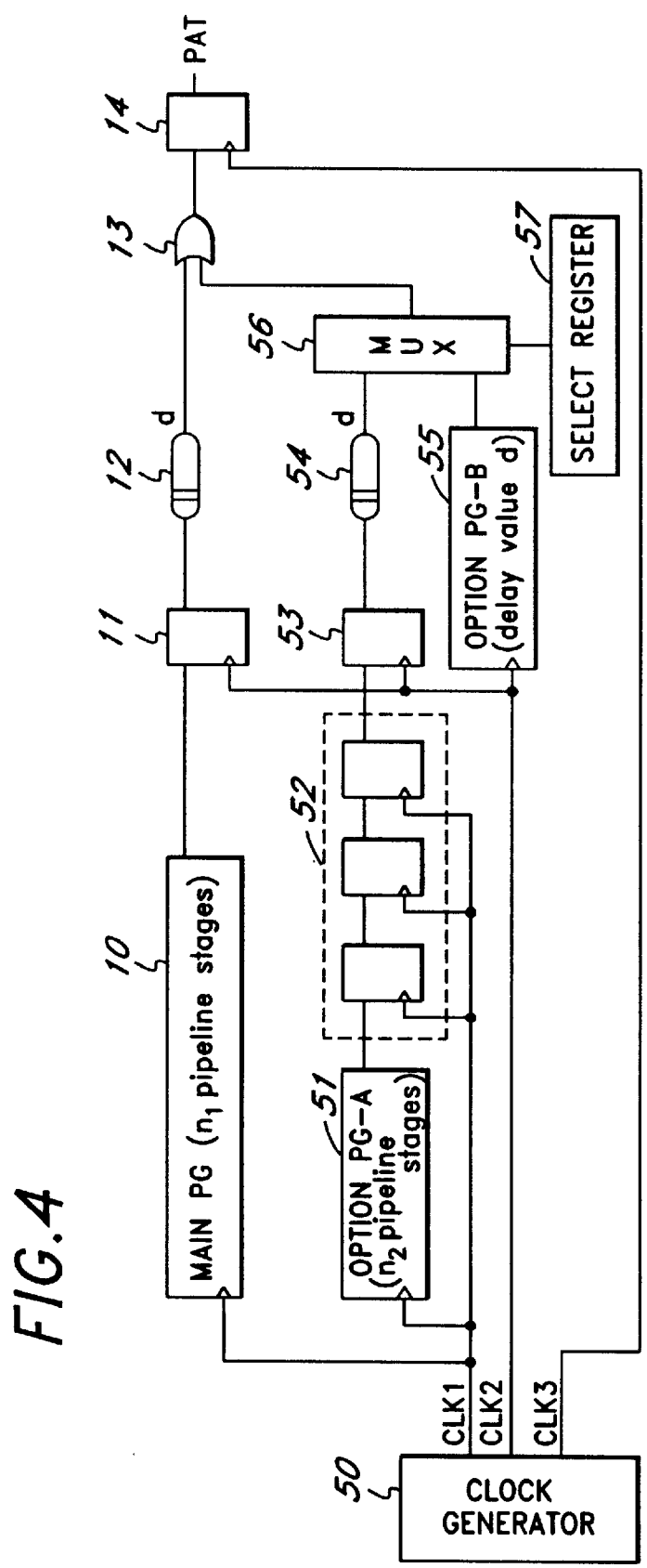
FIG. 4 is a block diagram of a conventional pattern generator.
Figure 5:
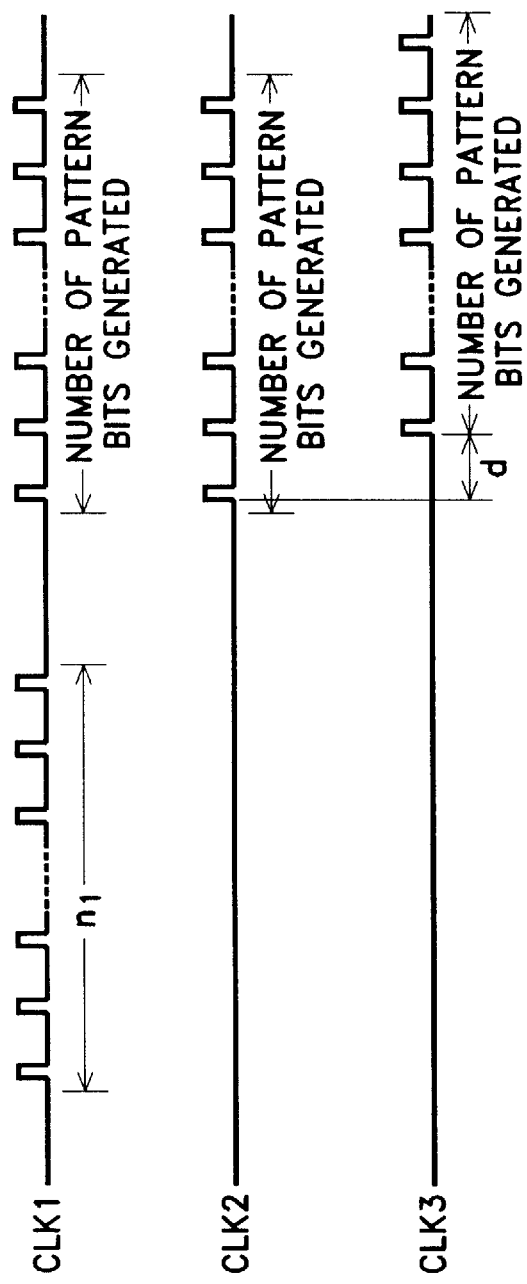
FIG. 5 is an example of a timing diagram for a conventional pattern generator.

First, pattern generation by PG 10 will be described. As shown by CLK1, CLK2, and CLK3 in the timing diagram of FIG. 3, to initialize PG 10, which has $n_1$ pipeline stages, the pipeline is filled with $n_1$ CLK1 clocks. Pattern data clocked out of main PG 10 by subsequent CLK1 clocks is clocked into register 11 by CLK2. The output of register 11 is clocked through delay circuit A (12) and logic circuit 13 into register 14 by CLK3, which is delayed by d amount with respect to CLK2, all of which ends up generating a pattern signal (PAT) consisting of p1 bits.

Next, pattern generation by an option PG will be explained, using the operation of option PG-A (27), which has $n_2$ pipeline stages, as an example. First (as shown in FIG. 2), a value for $n_2$, the number of pipeline stages, is written into initial clock register 41 in option PG initial clock control section 21 by WCMD1, and a value that will provide a divided clock frequency at which option PG-A (27) is capable of operating, is written into clock division ratio register 42 by WCMD2. Then, after the data contained in initial clock register 41 ($n_2$) has been loaded into counter 44 by the LOADCMD signal, clock 4 is generated, causing the count in counter 44 to be counted [down] by the divided clock divided by clock divider circuit 43. Counter ≠0 detector circuit 45 outputs a "1" until $n_2$ divided clocks have been generated. The end result is the generation of an INITCLK signal having $n_2$ clocks.

At this time, select register 24 (FIG. 1) selects the CLKA output of clock output control section 26 to generate $n_2$ CLKA clocks. Select register 24 also selects the WCLKA and DATAA for output from multiplexer 30, applying $n_2$ of each to the WCLK and WDT inputs of FIFO section 31. In addition, $n_2$ INITCLK clocks are delayed by delay circuit D (35), and fed to the RCLK input of FIFO section 31. Through the above operation, option PG-A (27), having $n_2$ pipeline stages, is initialized by filling the pipeline with $n_2$ CLKA clocks. The CLKA clocks that follow, will clock out DATAA as the option PG-A (27) output, which will become the first data of the desired pattern. Option PG-A (27) and FIFO section 31 have now been initialized.

Each time the option PG selection changes, initial clock register 41 (in option PG initial clock control section 21) and clock division ratio register 42 are set to values that match the new selection.

The pattern data output from option PG-A (27) is controlled by an enable signal from main PG 10. This enable signal is first delayed to put it in phase with CLK2 (FIG. 3), then input to option PG clock control section 22 [as enable signal B]. During the time enable signal B is applied to it, option PG clock control section 22 outputs p2 clocks of a CLK2-synchronous clock signal, where p2 is the number of option PG pattern bits generated.

Clock output control section 26 outputs only the selected clock, so that only the option PG selected by select register 24 will operate. In this example, since option PG-A is selected, p2 clocks of only the CLKA signal are output. CLKA causes option PG-A (27) to operate, outputting pattern data (DATAA) along with WCLKA clocks. The pattern data is written into FIFO section 31. The enable signal is delayed in delay circuit B (33) to put it in phase with CLK2, further delayed in delay circuit C (34) to put it in phase with CLK5 (which is output synchronous with CLK3), and input to RCLK control section 23. During the time enable signal C is being input to RCLK control section 23, exactly p2 clocks of a CLK5-synchronous clock signal are output (where p2 is the number of option PG pattern bits generated). This clock signal is input to FIFO section 31 to clock out pattern data that was written into the FIFO by the WCLK signal. This pattern data is input to logic circuit 13, where it is ORed and fed into register 14 per CLK3 timing for output as the PAT (pattern) signal.

An option PG and FIFO section 31 having the desired number of pipeline stages, then, can be initialized by the INITCLK initial clock signal generated by option PG initial clock control circuit 21. In addition, for option PG having no pipeline configured for delay operation with a delay time within a range determined by d, the delay time can be absorbed by FIFO section 31.

Additionally, within a range determined by p1, the number of pattern bits generated by main PG 10, the number of pattern bits generated by the option PG can be controlled by an enable signal generated by main PG 10.

In the above embodiment, a clock output control section 26 is provided. In this clock output control section 26, only the selected clock signals are output, so that only the option PG selected by select register 24 will operate.

This clock output control section 26 may be eliminated, however, to provide a simpler clock distribution section. When this is done, only the selected PG output, as selected in multiplexer 30 by selector 24, can be output.

A multiplexer 30 is provided in each of the above embodiments so that the output from one of a plurality of option PGs can be selected for output. For a single option PG, however, multiplexer 30 may be omitted.

Because the present invention is constituted as described above, the following described results are realized.

An option PG and FIFO 31 can be initialized to have the desired number of pipeline stages by an INITCLK signal generated by option PG initial clock control section 21.

In addition, for an option PG with no pipeline, operating in delayed operation, within a range determined by delay time d, the delay time can be absorbed by FIFO section 31.

In addition, within a range determined by p1, where p1 is the number of pattern bits generated by main PG 10, the number of pattern bits generated by the option PG can be controlled by an enable signal generated by main PG 10.

Because of this, the freedom of design of the option PG is enhanced, and benefits will be realized in that, as long as the number of pattern bits generated and the delay do not exceed the values set for the main PG, the need for redesign in order to connect an option PG will be eliminated.

What is claimed is:

1. A pattern generator circuit for a semiconductor test system, comprising:
    a clock generator (20) for generating a plurality of clock signals;
    a main pattern generator (10) having a predetermined number of pipeline stages for generating a main pattern signal for testing semiconductor devices;
    an OR circuit (13) which transmits either said main pattern signal or an optional pattern signal generated by an optional pattern generator (27) for testing said semiconductor devices;
    a register (14) which receives an output of said OR circuit (13) in synchronism with a first clock signal (CLK3) from said clock signal generator and generates either said main pattern signal or said optional pattern signal;
    an optional PG initial clock controller (21) that generates an initial clock signal (INITCLK) which is synchronous with a second clock signal (CLK4) from said clock generator (20) for initializing said optional pattern generator (27) and a FIFO (First-In First-Out) section (31) by said initial clock signal (INITCLK);
    an optional PG clock controller (22) which provides a third clock signal (CLK2) to said optional pattern generator (27) a predetermined time after the start of pattern generation by said main pattern generator (10);
    a read clock (RCLK) control section (23) which provides a read clock signal that is synchronous with said first clock (CLK3) from said clock generator (20) a predetermined delay time after said third clock (CLK2) is output by said optional PG clock controller (22);
    wherein said optional pattern generator (27) first receives said initial clock signal (INITCLK) from said option PG initial clock controller (21) for initializing an internal state thereof and then receives said third clock signal (CLK2) for generating said optional pattern signal; and
    wherein said FIFO section (31) receives said optional pattern signal from said optional pattern generator (27) and provides said optional pattern signal to said OR circuit in synchronism with said read clock (RCLK).

2. A pattern generator circuit for a semiconductor test system as defined in claim 1, wherein said optional pattern generator includes a plurality of pattern generators (27, 28, 29) each of which is initialized by said initial clock signal (INITCLK) from said optional PG clock controller (22) and is driven by said third clock (CLK2) provided from said optional PG clock controller (22) a predetermined time after said start of said pattern generation by said main pattern generator (10) to generate said optional pattern signal.

3. A pattern generator circuit for a semiconductor test system as defined in claim 2, wherein one of optional pattern signals generated by said plurality of pattern generators (27, 28, 29) is selected by a multiplexer (30) to be provided to said FIFO section (31).

4. A pattern generator circuit for a semiconductor test system as defined in claim 1, wherein said optional PG initial clock controller (21) comprising:
    an initial clock register (41) for storing data indicating a number of pipeline stages included in said optional pattern generator (27);
    a counter (44) for receiving said data from said initial clock register (41) and counting the number of pulses of said second clock signal (CLK4) defined by said data;
    a count end detection circuit (45) for detecting the end of counting said pulses by said counter (44); and
    a gate circuit for sending said second clock signal (CLK4) to said optional pattern generator (27) as said initial clock signal (INITCLK) until receiving a detection signal from said count end detection circuit (45).

5. A pattern generator circuit for a semiconductor test system as defined in claim 4, wherein said optional PG initial clock controller (21) further comprising:
    a clock division ratio register (42) for storing data indicating a ratio for dividing said second clock (CLK4) such that a frequency of said initial clock (INITCLK) matches a speed of said optional pattern generator; and a clock divider circuit (43) for dividing said second clock signal (CLK4) by said ratio from said clock division ratio register (42) so that a divided signal at the output of said clock divider circuit (43) is supplied to said counter and said gate circuit as a clock signal.

6. A pattern generator circuit for a semiconductor test system as defined in claim 1, wherein said main pattern generator (10) provides an enable signal indicating said start of said pattern generation by said main pattern generator (10) to said optional PG clock controller (22).

7. A pattern generator circuit for a semiconductor test system as defined in claim 1, wherein said read clock (RCLK) control section (23) receives an enable signal from said main pattern generator (10) via a delay circuit (34), said enable signal indicating said start of said pattern generation by said main pattern generator (10).

8. A pattern generator circuit for a semiconductor test system, comprising:

a clock generator (20) for generating a plurality of clock signals;

a main pattern generator (10) having a predetermined number of pipeline stages for generating a main pattern signal for testing semiconductor devices;

an OR circuit (13) which transmits either said main pattern signal or an optional pattern signal generated by an optional pattern generator (27) for testing said semiconductor devices, said optional pattern generator including a plurality of pattern generators (27, 28, 29);

a register (14) which receives an output of said OR circuit (13) in synchronism with a first clock signal (CLK3) from said clock signal generator and generates either said main pattern signal or said optional pattern signal;

an optional PG initial clock controller (21) that generates an initial clock signal (INITCLK) which is synchronous with a second clock signal (CLK4) from said clock generator (20) for initializing said optional pattern generator (27) and a FIFO (First-In First-Out) section (31) by said initial clock signal (INITCLK);

an optional PG clock controller (22) which provides a third clock signal (CLK2) to said optional pattern generator (27) a predetermined time after the start of pattern generation by said main pattern generator (10);

a select register (24) for storing select data indicating one of said optional pattern generators (27, 28, 29) selected to generate said optional pattern signal in sequence with said main pattern signal;

a clock output control section (26) for selectively providing said initial clock signal (INITCLK) and said third clock signal (CLK2) to one of said optional pattern generators (27, 28, 29) based on said select data from said select register (24);

a multiplexer (30) for selectively providing an output signal from one of said optional pattern generators to said FIFO section (31) based on said select data from said select register (24);

a read clock (RCLK) control section (23) which provides a read clock signal that is synchronous with said first clock (CLK3) output from said clock generator (20) a predetermined delay time after said third clock (CLK2) is generated by said optional PG clock controller (22);

wherein said optional pattern generator (27) first receives said initial clock signal (INITCLK) from said option PG initial clock controller (21) for initializing an internal state thereof and then said third clock signal (CLK2) for generating said optional pattern signal; and wherein said FIFO section (31) receives said optional pattern signal from one of said option pattern generators (27, 28, 29) via said multiplexer (30) and provides said optional pattern signal to said OR circuit in synchronism with said read clock (RCLK).

9. A pattern generator circuit for a semiconductor test system as defined in claim 8, each of said plurality of optional pattern generators (27, 28, 29) is initialized by said initial clock signal (INITCLK) from said optional PG clock controller (22) via said clock output control section (26) and is driven by said third clock (CLK2) provided from said optional PG clock controller (22) via said clock output control section (26) a predetermined time after said start of said pattern generation by said main pattern generator (10) to generate said optional pattern signal.

10. A pattern generator circuit for a semiconductor test system as defined in claim 8, wherein said optional PG initial clock controller (21) comprising:

an initial clock register (41) for storing data indicating a number of pipeline stages included in said optional pattern generator;

a counter (44) for receiving said data from said initial clock register (41) and counting the number of pulses of said second clock signal (CLK4) defined by said data;

a count end detection circuit (45) for detecting the end of counting said pulses by said counter (44); and a gate circuit for sending said second clock signal to said optional pattern generator (27) as said initial clock signal (INITCLK) until receiving a detection signal from said count end detection circuit (45).

11. A pattern generator circuit for a semiconductor test system as defined in claim 10, wherein said optional PG initial clock controller (21) further comprising:

a clock division ratio register (42) for storing data indicating a ratio for dividing said second clock (CLK4) such that a frequency of said initial clock (INITCLK) matches a speed of said optional pattern generator; and a clock divider circuit (43) for dividing said second clock signal (CLK4) by said ratio from said clock division ratio register 42 so that a divided clock at the output of said clock divider circuit (43) is supplied to said counter and said gate circuit.

* * * * *